(12) United States Patent
Terrovitis

(10) Patent No.: US 9,112,448 B2
(45) Date of Patent: Aug. 18, 2015

(54) ULTRA LOW-POWER HIGH FREQUENCY CRYSTAL OSCILLATOR FOR REAL TIME CLOCK APPLICATIONS

(71) Applicant: QUALCOMM Incorporated, San Diego, CA (US)

(72) Inventor: Emmanouil Terrovitis, Foster City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/065,240

(22) Filed: Oct. 28, 2013

(65) Prior Publication Data

US 2015/0116051 A1    Apr. 30, 2015

(51) Int. Cl.
    *H03B 5/36* (2006.01)

(52) U.S. Cl.
    CPC ............. *H03B 5/362* (2013.01); *H03B 5/364* (2013.01); *H03B 2200/005* (2013.01); *H03B 2200/0046* (2013.01); *H03B 2200/0052* (2013.01); *H03B 2200/0082* (2013.01); *H03B 2201/0266* (2013.01)

(58) Field of Classification Search
    CPC ............. H03B 5/06; H03B 5/32; H03B 5/36; H03B 5/362; H03B 5/364; H03B 5/366; H03B 2200/0052; H03B 2200/0046; H03B 2200/005; H03B 2200/0082; H03B 2200/0062
    USPC ........................ 331/116 R, 116 FE, 158, 160
    See application file for complete search history.

(56) References Cited

U.S. PATENT DOCUMENTS

| | | | |
|---|---|---|---|
| 6,943,639 B2 * | 9/2005 | Dahlin | 331/183 |
| 7,710,212 B2 | 5/2010 | Seliverstov | |
| 8,188,802 B2 | 5/2012 | Garcia | |
| 8,289,090 B2 | 10/2012 | Chen et al. | |
| 2005/0007205 A1 * | 1/2005 | Bridger | 331/108 C |
| 2008/0136541 A1 * | 6/2008 | Yoshinaga | 331/116 FE |
| 2008/0316867 A1 * | 12/2008 | Cheng et al. | 368/9 |
| 2012/0098609 A1 | 4/2012 | Verma et al. | |
| 2013/0076426 A1 * | 3/2013 | Chen | 327/291 |
| 2013/0171953 A1 | 7/2013 | Kuo et al. | |

FOREIGN PATENT DOCUMENTS

| | | |
|---|---|---|
| JP | S5991709 A | 5/1984 |
| JP | 2002135052 A | 5/2002 |

OTHER PUBLICATIONS

Partial International Search Report—PCT/US2014/061116—ISA/EPO—Dec. 22, 2014.
International Search Report and Written Opinion—PCT/US2014/061116—ISA/EPO—Nov. 3, 2015.

* cited by examiner

*Primary Examiner* — Ryan Johnson
(74) *Attorney, Agent, or Firm* — Mahamedi Paradice LLP

(57) ABSTRACT

An oscillator circuit may selectively switch between a normal mode and a low-power mode in response to a mode signal. During the normal mode, the oscillator circuit may employ a first amplifier configuration and a first capacitive loading to generate a high-accuracy clock signal having a relatively low frequency error. During the low power mode, the oscillator circuit may employ a second amplifier configuration and a second capacitive loading to generate a low-power clock signal using minimal power consumption. A compensation circuit may be used to offset a relatively high frequency error during the low-power mode.

9 Claims, 7 Drawing Sheets

ULTRA LOW-POWER HIGH FREQUENCY CRYSTAL OSCILLATOR FOR REAL TIME CLOCK APPLICATIONS

TECHNICAL FIELD

The present embodiments relate generally to oscillator circuits, and specifically to oscillator circuits that may operate in a normal mode or in a low-power mode.

BACKGROUND OF RELATED ART

Crystal oscillators generate timing signals for many components of communication devices (e.g., smartphones). For example, crystal oscillators may be used to generate a highly accurate reference clock signal that, in turn, may be used by frequency synthesizers to generate RF carrier signals (e.g., to facilitate wireless data transmissions). Crystal oscillators may also be used to generate low-power real-time clock (RTC) signals that, in turn, may be used for timekeeping functions during low-power modes (e.g., to allow a mobile station to wake-up from a sleep state at certain intervals to listen for beacon transmissions from an associated access point). As a result, communication devices typically include one crystal oscillator to generate the high frequency reference clock signals and include another crystal oscillator to generate the low-power RTC signals. However, the inclusion of multiple crystal oscillators in a communication device may consume a significant amount of circuit area and increase cost.

Thus, there is a need to provide an oscillator circuit that may selectively generate relatively high-accuracy clock signals and relatively low-power clock signals using a single crystal.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

An oscillator circuit is disclosed that may dynamically switch between a normal mode and a low-power mode in response to a mode signal. For some embodiments, the oscillator circuit includes a crystal, a first amplifier circuit, a second amplifier circuit, first and second variable capacitors, and a switching circuit. The crystal may generate an oscillating signal. The first amplifier circuit, which may include a first bias resistor coupled across the crystal and a first transistor coupled between the crystal and ground potential, may amplify the oscillating signal to generate a high-accuracy clock signal during the normal mode. The second amplifier circuit, which may include a second bias resistor coupled across the crystal and a second transistor coupled between the crystal and ground potential, may amplify the oscillating signal to generate a low-power clock signal during the low-power mode. The switching circuit may selectively couple either the first amplifier circuit or the second amplifier circuit across the crystal in response to the mode signal. The first variable capacitor is coupled between a first node of the crystal and ground potential, and includes a control terminal responsive to the mode signal. The second variable capacitor is coupled between a second node of the crystal and ground potential, and includes a control terminal responsive to the mode signal.

When the oscillator circuit is to operate in the normal mode, the mode signal may be driven to a first state that sets the capacitance values of the first and second variable capacitors to nominal values that cause the oscillator circuit to generate a high-accuracy reference clock signal in a manner that minimizes a frequency error of the clock signal. The first state of the mode signal may also cause the switching circuit to couple the first amplifier circuit across the crystal and to isolate the second amplifier circuit from the crystal.

When the oscillator circuit is to operate in the low-power mode, the mode signal may be driven to a second state that sets the capacitance values of the first and second variable capacitors to relatively low (e.g., to minimum) values that cause the oscillator circuit to generate a low-power RTC signal in a manner that minimizes power consumption (e.g., as compared to the normal mode). Although reducing the capacitance values of the first and second variable capacitors may increase the frequency error of the clock signal generated by the oscillator circuit, the frequency error may be predicted and accounted for (e.g., using a compensation circuit). The second state of the mode signal may also cause the switching circuit to couple the second amplifier circuit across the crystal and to isolate the first amplifier circuit from the crystal.

For some embodiments, the oscillator circuit may also include one or more automatic gain control circuits that may monitor an amplitude of the clock signal and, in response thereto, may adjust a bias current provided to either the first or second amplifier circuit, for example, to minimize power consumption. A common automatic gain control circuit, or alternatively two different automatic gain control circuits optimized for the two different modes of operation, may be used.

BRIEF DESCRIPTION OF THE DRAWINGS

The present embodiments are illustrated by way of example and are not intended to be limited by the figures of the accompanying drawings, where like reference numerals refer to corresponding parts throughout the drawing figures.

DETAILED DESCRIPTION

A method and apparatus for generating clock signals using oscillator circuits having a normal mode of operation and a low-power mode of operation are disclosed. In the following description, numerous specific details are set forth to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. Further, the logic levels assigned to various signals in the description below are arbitrary, and therefore may be modified (e.g., reversed polarity) as desired.

In addition, circuits described or depicted herein as including metal oxide semiconductor (MOS) transistors may alternatively be implemented using bipolar transistors or any other technology in which a signal-controlled current flow may be achieved. Also, signals referred to herein as clock signals may alternatively be strobe signals or any other signals that provide timing control and/or that oscillate at one or more given frequencies. Accordingly, the present embodiments are not to be construed as limited to specific examples described herein but rather include within their scope all embodiments defined by the appended claims.

Figure 1:
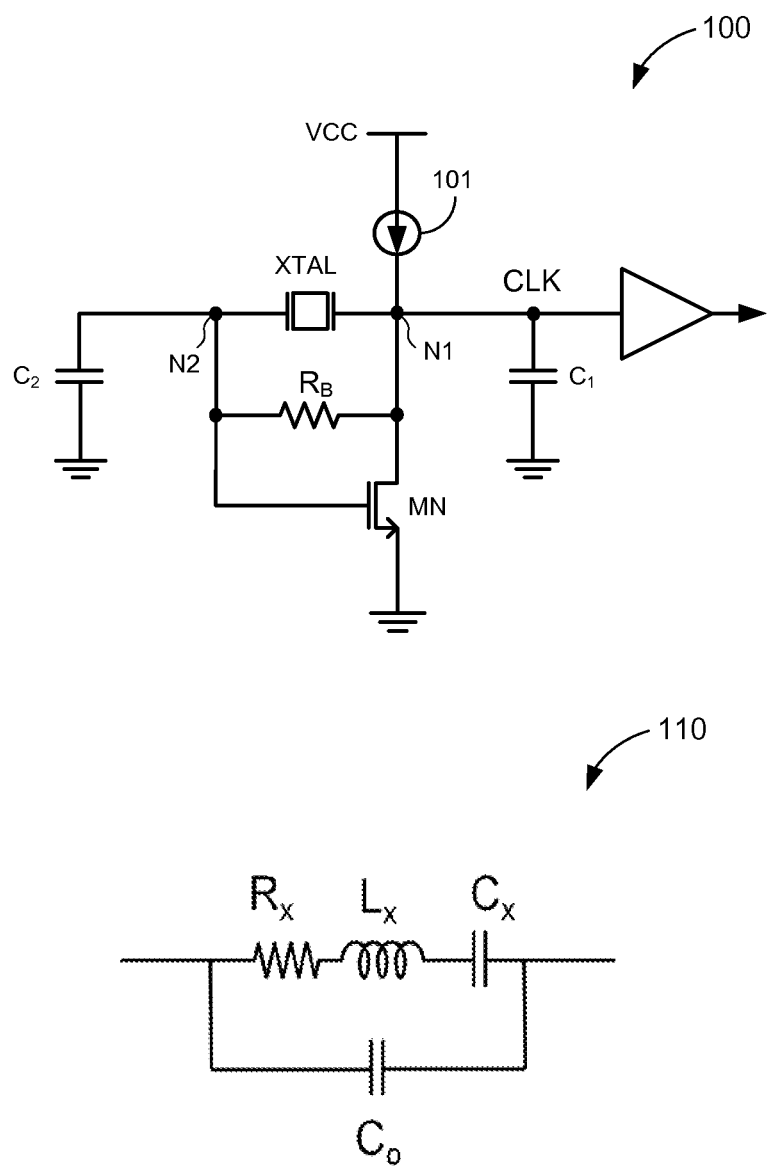
FIG. 1 is a block diagram of a conventional crystal oscillator circuit.

FIG. 1 shows a conventional crystal oscillator circuit 100. A crystal (XTAL) and a bias resistor $R_B$ are coupled between nodes N1 and N2. A transistor MN coupled between node N1 and ground potential, and including a gate coupled to node N2, operates as a gain element to amplify an oscillating signal provided by the XTAL (e.g., to ensure that the amplitude of the oscillating signal is maintained above a certain threshold level). Load capacitors $C_1$ and $C_2$ are connected between ground potential and nodes N1 and N2, respectively. A current source 101 provides a bias current for transistor MN. The resistor $R_B$ has a large value and biases the gate of the transistor MN to the same DC voltage as the drain of MN. The oscillator circuit 100 generates an oscillating clock signal (CLK) at node N1. The values of capacitors $C_1$ and $C_2$, which are usually equal, determine the loading capacitance $C_L$ of the oscillator circuit 100:

$$C_L = \frac{C_1 C_2}{C_1 + C_2} \quad (1)$$

An equivalent electrical circuit 110 is shown for the XTAL of oscillator circuit 100. The frequency of the clock signal CLK, denoted as $f_{osc}$, may be expressed as:

$$f_{osc} = f_s \sqrt{1 + \frac{C_x}{C_L + C_o}} \quad (2)$$

where $f_s$ is the series resonance of the XTAL:

$$f_s = \frac{1}{\sqrt{L_x C_x}} \quad (3)$$

Note that because $C_x$ is of the order of 1 fF and $C_L$ is of the order of several pF (e.g., $C_L >> C_x$), the value of $f_{osc}$ is close to the value of $f_s$ (e.g., $f_{osc} \approx f_s$).

The oscillator circuit 100 may be designed to oscillate at the specified value of $f_{osc}$ when the XTAL is connected to a nominal load value $C_{LO}$ (i.e., when $C_L = C_{LO}$). If the actual load capacitance $C_L$ is different than the nominal load capacitance $C_L$, then the actual oscillation frequency may be different than the specified oscillation frequency $f_{osc}$. The difference between the actual oscillation frequency and the specified oscillation frequency is known as the oscillation frequency error, which may be expressed as:

$$\Delta f_{osc} = f_s \left( \sqrt{1 + \frac{C_x}{C_L + C_O}} - \sqrt{1 + \frac{C_x}{C_{LO} + C_O}} \right) \quad (4)$$

or $$\Delta f_{osc} = -f_s \frac{C_x}{2} \left( \frac{\Delta C_L}{(C_{LO} + C_O)(C_L + C_O)} \right) \quad (4a)$$

For small capacitive load errors, the oscillation frequency error may be expressed in parts-per-million (ppm), as given by:

$$\frac{\Delta f_{osc}}{f_{osc}} = -\frac{1}{2} \frac{C_x}{(C_{LO} + C_O)(C_L + C_O)} \Delta C_L \quad (5)$$

The loop gain ($A_L$) of the oscillator circuit 100 may be expressed as:

$$A_L = G_m R_L \frac{C_1}{C_2} \quad (6)$$

where $G_m$ is the transconductance of transistor MN, and $R_L$ is the resistive loading on transistor MN. The value of the resistive loading $R_L$ may be expressed as three individual resistances coupled in parallel:

$$R_L = R'_L // r_d // R_{Bo} \quad (7)$$

The value of $r_o$ corresponds to the output resistance of transistor MN and current source 101. The value of $R'_L$, which corresponds to the series resistance of the XTAL, may be expressed as:

$$R'_L = \frac{1}{R_x (2\pi f C_1)^2} \quad (8)$$

The value of $R_{Bo}$, which corresponds to the resistive loading from the bias resistor $R_B$, may be expressed as:

$$R_{Bo} = R_B \left( \frac{C_2}{C_1 + C_2} \right)^2 \quad (9)$$

Note that because the values of $R_{Bo}$ and $r_o$ are much larger than the value of $R_L'$, the value of $R_L'$ dominates the resistive loading $R_L$ on transistor MN (e.g., $R'_L \approx R_L$).

To initiate oscillation of the clock signal CLK, the loop gain $A_L$ of oscillator circuit 100 must be greater than or equal to 1. However, to ensure oscillation of the clock signal CLK for different manufacturing process corners and/or for different temperatures, the nominal value of the loop gain $A_L$ is typically much greater than one. The loop gain $A_L$ of the oscillator circuit 100 may be adjusted by changing the transconductance of the transistor MN. More specifically, the value of the loop gain $A_L$ may be increased (e.g., to a level that ensures sustained oscillations of the clock signal CLK) by increasing the transconductance $G_m$ of transistor MN, which in turn may be increased by increasing the bias current provided to transistor MN by current source 101. However, increasing the bias current provided to transistor MN results in greater power consumption, which is not desirable for low-power modes of operation. Thus, the oscillator circuit 100 of FIG. 1 may not be suitable for generating low-power RTC signals.

In accordance with the present embodiments, an oscillator circuit suitable for the generation of high-accuracy reference clock signals may be dynamically re-configured for the generation of low-power RTC signals. More specifically, during a normal mode of operation, the oscillator circuit may be configured to generate reference clock signals having a relatively low frequency error (albeit at the cost of relatively high power consumption), and during a low-power mode of operation, the oscillator circuit may be configured to generate RTC signals with relatively low power consumption (albeit at the cost of relatively high frequency error). For the low-power mode, the frequency error may be estimated and then provided to circuits (not shown for simplicity) using the RTC signal as an offset signal to compensate for the frequency error. For some embodiments, the frequency of the high-accuracy reference clock signal may be substantially the same as the frequency of the RTC signal. For such embodiments, the RTC signal may be provided to a divide-by-N circuit to down convert the RTC signal from an initial range in the tens of MHz to a desired range in the tens of kHz.

Figure 2A:
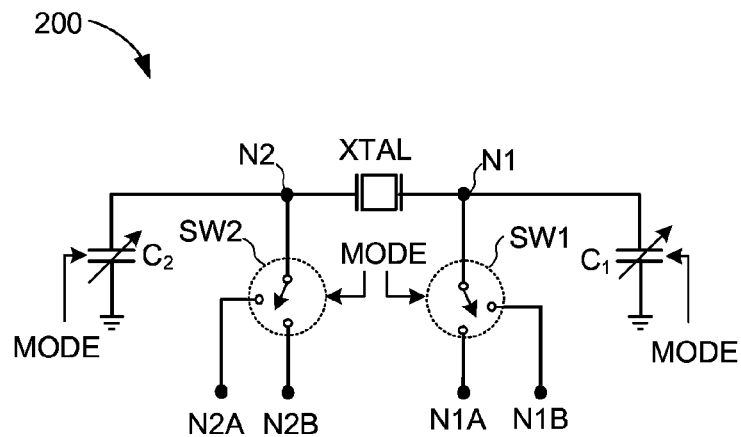
FIG. 2A is a block diagram of an oscillator circuit in accordance with some embodiments.
Figure 2A:
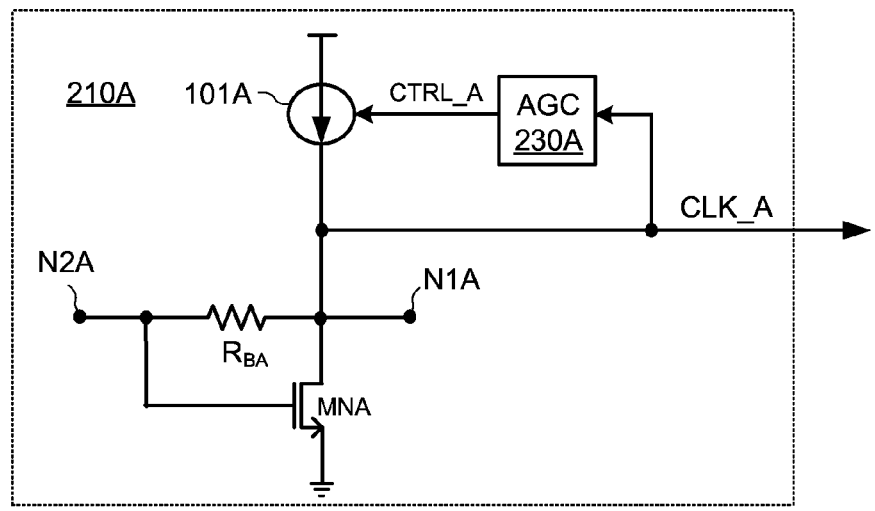
Figure 2A:
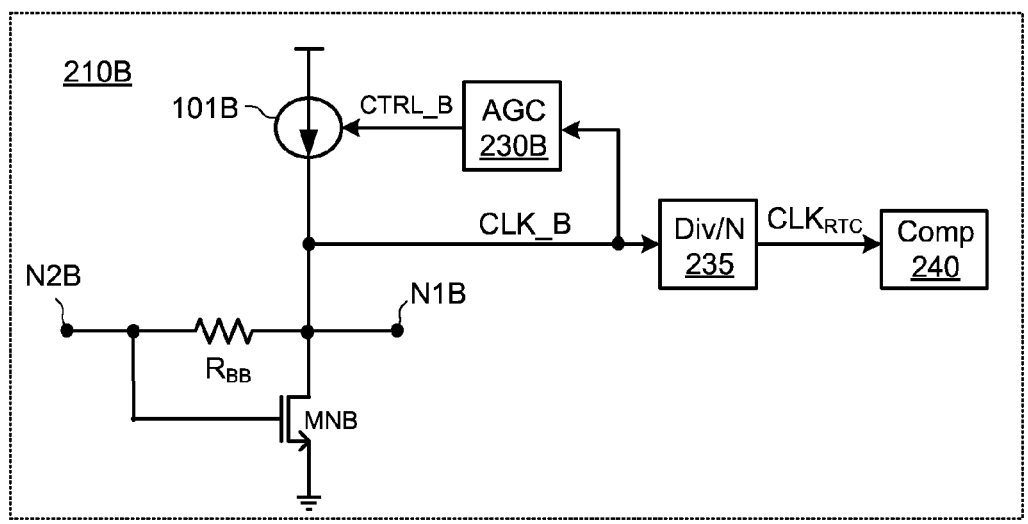

FIG. 2A shows an oscillator circuit 200 that, in accordance with the present embodiments, may selectively operate in either a normal mode of operation or in a low-power mode of operation, for example, in response to a mode signal (MODE). The oscillator circuit 200 includes a XTAL, a first variable capacitor $C_1$, a second variable capacitor $C_2$, a switching circuit including a first switch SW1 and a second switch SW2 responsive to a mode signal, a first amplifier circuit 210A, and a second amplifier circuit 210B. As described in more detail below, the first amplifier circuit 210A may be coupled across the XTAL during the normal mode to generate a high-accuracy clock signal CLK_A, and the second amplifier circuit 210B may be coupled across the XTAL during the low power mode to generate a low-power clock signal CLK_B, which in turn may be used to generate a low-power RTC signal $CLK_{RTC}$.

The first amplifier circuit 210A includes its own transconductance device (e.g., transistor) MNA, a first bias resistor $R_{BA}$, a first current source 101A, and a first automatic gain control (AGC) circuit 230A. The second amplifier circuit 210B includes its own transconductance device (e.g., transistor) MNB, a second bias resistor $R_{BB}$, a second current source 101B, a second AGC circuit 230B, a divide-by-N circuit 235, and a compensation circuit 240. The switching circuit (e.g., as formed by switches SW1 and SW2) may selectively couple either the first amplifier circuit 210A or the second amplifier circuit 210B in parallel with the XTAL (e.g., between nodes N1 and N2) in response to the MODE signal. During the normal mode, the first amplifier circuit 210A generates the high-accuracy clock signal CLK_A, while during the low-power mode, the second amplifier circuit 210B generates the low-power clock signal CLK_B. The clock signal CLK_B is divided in frequency by the divide-by-N circuit 235 to generate the RTC signal $CLK_{RTC}$, which in turn is provided as an input signal to the compensation circuit 240. The compensation circuit 240 may apply an offset value to $CLK_{RTC}$ that compensates for a predetermined frequency error associated with CLK_B.

For other embodiments, the first amplifier circuit 210A and the second amplifier circuit 210B may share the same bias resistor (e.g., resistor $R_{BA}$), may share the same transconductance device (e.g., transistor MNA), may share the same AGC circuit (e.g., AGC circuit 230A), and/or may share the same current source (e.g., current source 101A).

For some embodiments, the values of the variable capacitors $C_1$ and $C_2$ may be adjusted in response to the MODE signal (although other control or enable signals may be used to adjust the capacitance values of $C_1$ and $C_2$). More specifically, when the oscillator circuit 200 is to operate in the normal mode (e.g., to generate a high-accuracy reference clock signal), the capacitance values of variable capacitors $C_1$ and $C_2$ may be set to their nominal values (i.e., such that the resulting capacitive load $C_L$ on the XTAL causes the clock signal CLK_A to oscillate at the specified frequency, $f_{osc}$). When the oscillator circuit 200 is to operate in the low-power mode (e.g., to generate a low-power RTC signal), the capacitance values of variable capacitors $C_1$ and $C_2$ may be set to minimum values (e.g., that are much less than their nominal values). More specifically, setting the capacitance values of variable capacitors $C_1$ and $C_2$ to minimum values may increase the value of the resistive load $R_L$ upon the XTAL (i.e., as indicated by Eq. 8), which in turn may allow a lower transconductance value $G_m$ to achieve a desired minimum value of the loop gain $A_L$ for oscillator circuit 200 (i.e., as indicated by Eq. 6). The lower transconductance value $G_m$ may be achieved by using a lower bias current from source 101B in the second amplifier circuit 210B (e.g., as compared with the bias current provided by source 101A in the first amplifier circuit 210A). Thus, when operating in the low-power mode, power consumption may be reduced (e.g., as compared with the normal mode) by reducing the capacitance values of the variable capacitors $C_1$ and $C_2$ to minimum values.

Further, for some embodiments, the operating characteristics of the first amplifier circuit 210A may be selected to minimize frequency errors, while the operating characteristics of the second amplifier circuit 210B may be selected to minimize power consumption. More specifically, a larger device size for transistor MNA may be selected in the normal mode to facilitate implementing the higher transconductance associated with the normal mode, while a smaller device size for transistor MNB may be selected in the low power mode to reduce the capacitive loading of the oscillator with the parasitic device capacitances. In addition, a longer channel length may be selected for transistor MNB to provide a higher output impedance and/or to reduce the resistive loading of the oscillator according to Eq. 7. Similarly, the current source 101B in the second amplifier circuit 210B (used in the low-power mode) may be implemented with a smaller and longer device than the current source 101A in the first amplifier circuit 210A (used in the normal mode) to reduce capacitive loading and increase output resistance. A relatively low bias resistor $R_{BA}$ may not significantly lower the equivalent resistive loading of the oscillator in the normal mode (which is dominated by the lower $R_L'$, as indicated by Eq. 7 and Eq. 8), while using a relatively high bias resistor $R_{BA}$ in the normal mode may be problematic, for example, by causing large voltage drops with a small gate leakage current in the relatively large transistor MNA and long time constants with the significant capacitance at node N2. A relatively high bias resistor $R_{BB}$ is selected in the low power mode to avoid loading the oscillator, and may not be problematic because of the relatively small size of transistor MNB (e.g., compared to transistor MNA) and the low capacitance connected to node N2.

For some embodiments, the transconductance values of the first and second transistors MNA and MNB may be adjusted by changing the physical dimensions (e.g., channel width and channel length), the doping concentrations, and/or other characteristics of the transistors MNA and MNB. Similarly, resistor $R_{BA}$ may be implemented as part of the larger $R_{BB}$.

The first AGC circuit 230A includes an input terminal coupled to the clock signal CLK_A, and includes an output terminal to provide a control signal (CTRL_A) to the current source 101A. The first AGC circuit 230A may monitor an amplitude of the clock signal CLK_A and, in response thereto, may adjust the value of CTRL_A so that the current source 101A provides the minimal amount of bias current to first amplifier circuit 210A that results in the clock signal CLK_A having a sufficiently detectable amplitude. Although not shown for simplicity, for some embodiments, the first AGC circuit 230A may include a peak detector that determines whether the amplitude of the clock signal CLK_A is sufficient for detection, and may include a comparator to generate the control signal CTRL_A in response to a comparison of the amplitude (e.g., voltage level) of the clock signal CLK_A with a reference voltage. In this manner, the first AGC circuit 230A may minimize power consumption by minimizing the amount of bias current provided to the first amplifier circuit 210A.

The second AGC circuit 230B, which operates in a manner similar to that of first AGC circuit 230A, senses the amplitude of the clock signal CLK_B and adjusts the bias current source 101B through the control signal CTRL_B such that a minimum detectable amplitude of CLK_B is maintained. Alternatively, the first AGC circuit 230A and/or the second AGC circuit 230B may sense a buffered and/or amplified version of clock signals CLK_A and CLK_B, respectively, instead of the oscillator waveforms at nodes N1A and N1B, respectively.

The compensation circuit 240 may offset a known frequency error associated with generating the clock signal (CLK_B). More specifically, after the divide-by-N circuit 235 generates the RTC signal $CLK_{RTC}$ by frequency dividing the clock signal CLK_B, the compensation circuit 240 may apply an offset value to the RTC signal $CLK_{RTC}$ to compensate for the above-mentioned frequency errors associated with the low-power clock signal CLK_B. In this manner, undesirable frequency errors resulting from operating oscillator circuit 200 at a reduced power level may be estimated and then removed from the clock signal (CLK_B), as described in more detail below.

Figure 2B:
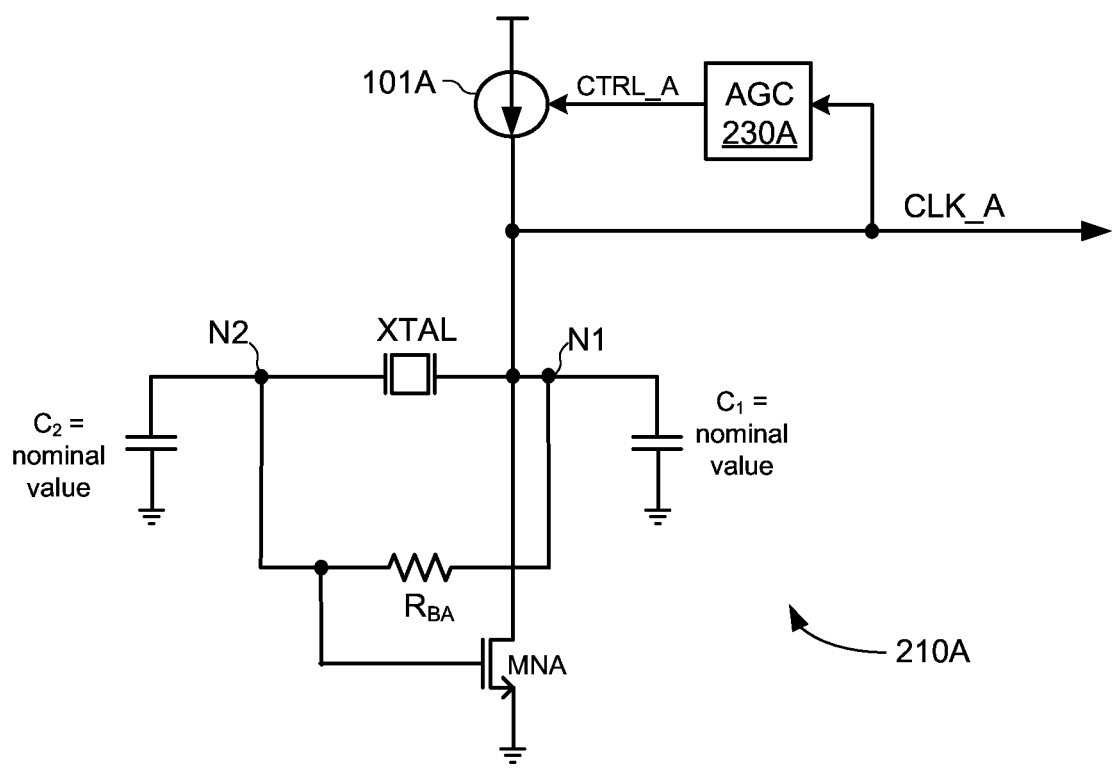
FIG. 2B is a block diagram of the oscillator circuit of FIG. 2A configured to operate in a normal mode.

An exemplary operation of oscillator circuit 200 is described below with respect to FIGS. 2A-2C. When it is desired for oscillator circuit 200 to generate a high-accuracy reference clock signal (e.g., in a manner that minimizes frequency error), the MODE signal may be driven to a first state to place the oscillator circuit 200 into the normal mode of operation, as depicted in FIG. 2B. The first state of the MODE signal may set the values of variable capacitors $C_1$ and $C_2$ to their nominal values (e.g., such that the resulting capacitive load $C_L$ on the XTAL causes the clock signal CLK_A to have the specified frequency $f_{osc}$). For some embodiments, typical nominal values for each of variable capacitors $C_1$ and $C_2$ are in the range of 12 pF to 40 pF.

Further, as described above, the first state of the MODE signal causes the switching circuit to couple the first amplifier circuit 210A across the XTAL and to isolate the second amplifier circuit 210B from the XTAL. More specifically, in response to the first state of the MODE signal, the first switch SW1 connects node N1 to node N1A and the second switch SW2 connects node N2 to node N2A, thus coupling amplifier 210A to the XTAL and to the capacitors $C_1$ and $C_2$. As a result, the first amplifier circuit 210A may be used to amplify the oscillation signal, provided by the XTAL, to generate the clock signal CLK_A as a high-accuracy reference clock signal.

Figure 2C:
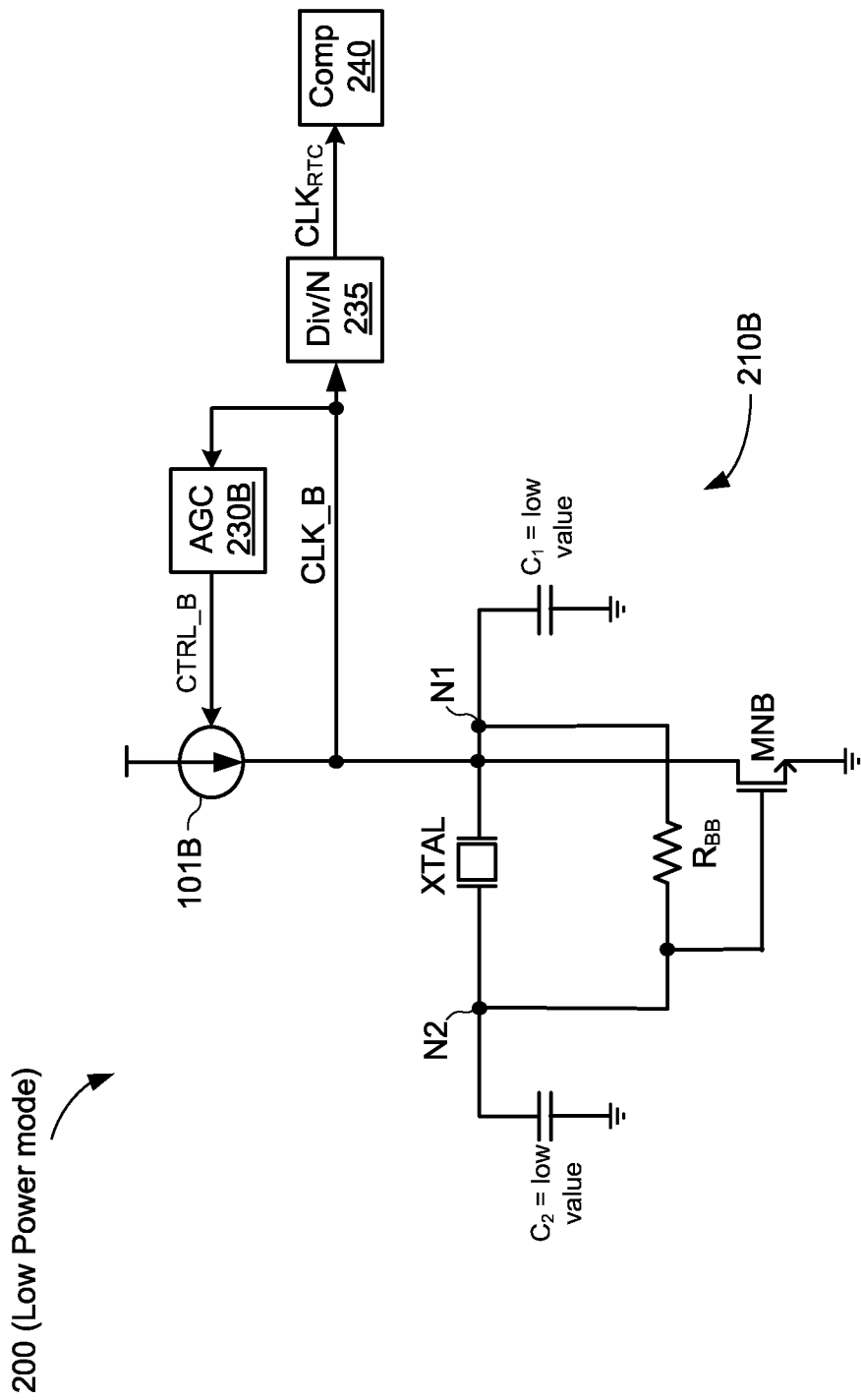
FIG. 2C is a block diagram of the oscillator circuit of FIG. 2A configured to operate in a low-power mode.

When it is desired for oscillator circuit 200 to generate a low-power RTC signal (e.g., in a manner that minimizes power consumption), the MODE signal may be driven to a second state to place the oscillator circuit 200 into the low-power mode of operation, as depicted in FIG. 2C. The second state of the MODE signal may set the values of variable capacitors $C_1$ and $C_2$ to minimum (or zero) values. As described above, setting the capacitances of variable capacitors $C_1$ and $C_2$ to minimum values may increase the value of the resistive load $R_L$ on the XTAL (i.e., as indicated by Eq. 8), which in turn may allow a lower transconductance $G_m$ for second transistor MNB to achieve the desired loop gain of $A_L=1$ (i.e., as indicated by Eq. 6). The transconductance $G_m$ of second transistor MNB may be reduced by the low bias current provided by current source 101B, which in turn reduces power consumption of oscillator circuit 200. For some embodiments, the minimum value for each of variable capacitors $C_1$ and $C_2$ is typically 0.5 pF.

Further, the second state of the MODE signal causes the switching circuit to couple the second amplifier circuit 210B across the XTAL and to isolate the first amplifier circuit 210A from the XTAL. More specifically, in response to the second state of the MODE signal, the first switch SW1 connects node N1 to node N1 B, and the second switch SW2 connects node N2 to node N2B, thus coupling the second amplifier circuit 210B to the XTAL and the capacitors $C_1$ and $C_2$. As a result, the second amplifier circuit 210B may be used to amplify the oscillation signal, provided by the XTAL, to generate the clock signal CLK_B. CLK_B is frequency-divided by the divide-by-N circuit 235 to generate the RTC signal $CLK_{RTC}$, which in turn is provided as a low-power RTC signal.

Although reducing the capacitive load $C_L$ on the XTAL may increase the frequency error of clock CLK_B (i.e., as indicated by Eq. 5), the frequency error may be predicted or estimated and then removed by associated compensation circuit 240 that uses the output clock signal $CLK_{RTC}$. For example, if the frequency error increases from 10 ppm (for the high-accuracy reference clock signal) to 400 ppm (for the low-power RTC signal), then the circuit using the RTC clock may compensate for the increased frequency error by adjusting the number of clock edges that are associated with a given unit of time. In this manner, oscillator circuit 200 may allow an increase in frequency error of the output clock signal (CLK_B) in order to reduce overall power consumption, and compensation circuit 240 may compensate for the known increased frequency error.

Figure 3:
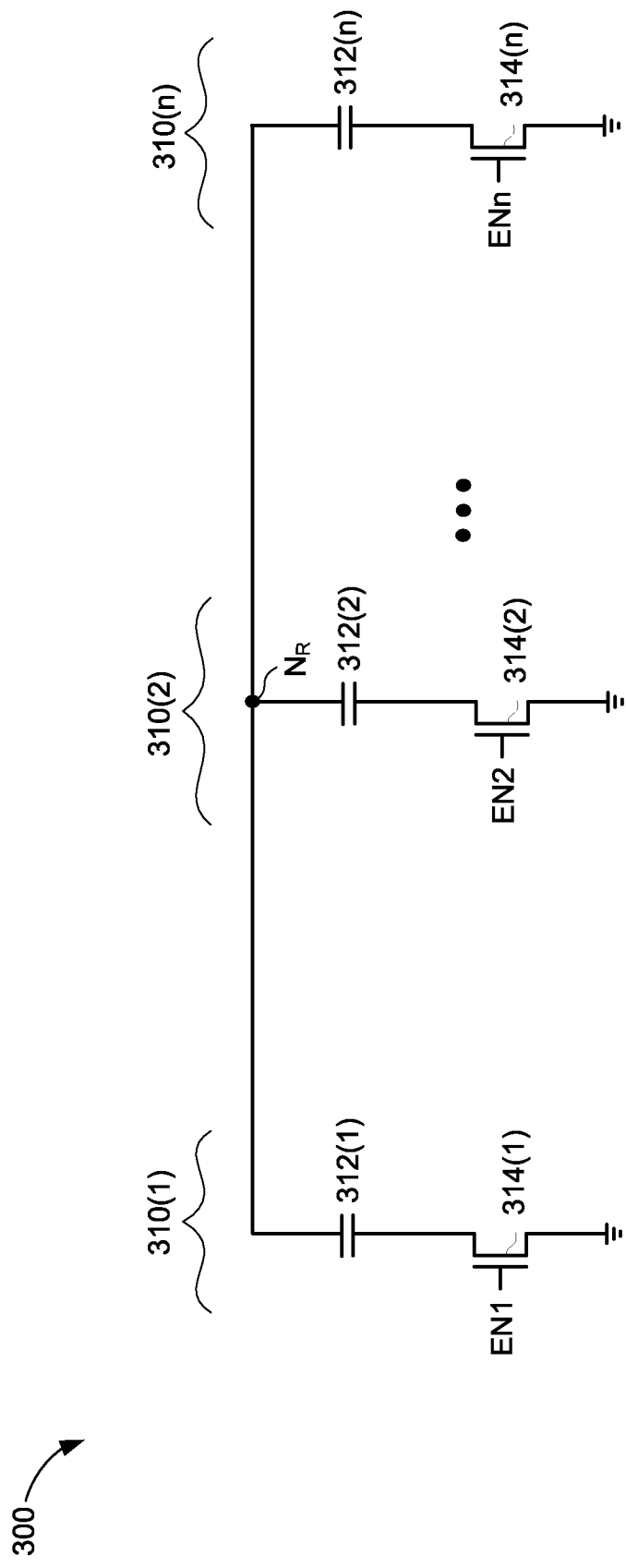
FIG. 3 is a circuit diagram of a programmable capacitor circuit that, in accordance with some embodiments, may be used as the variable capacitors of FIG. 2A.

For some embodiments, the variable capacitors $C_1$ and $C_2$ may each include a plurality of capacitors selectively connected in parallel with each other (e.g., in response to the MODE signal). For example, FIG. 3 shows a programmable capacitor circuit 300 that may be used as variable capacitor $C_1$ and/or variable capacitor $C_2$ in the oscillator circuit 200 of FIG. 2A. Capacitor circuit 300 may include any number n of individually selectable capacitor circuits 310(1)-310(n), coupled in parallel between a respective node $N_R$ of the XTAL and ground potential, to provide an adjustable capacitance value. The node $N_R$ may correspond to node N1 and/or node N2 of the oscillator circuit 200 of FIG. 2A. As shown in FIG. 3, the first capacitor circuit 310(1) includes a first capacitor 312(1) and a first transistor 314(1) coupled in series between node $N_R$ and ground potential. The transistor 314(1), which may operate as a switching element, includes a gate to receive a first enable signal $EN_1$. The second capacitor circuit 310(2) includes a second capacitor 312(2) and a second transistor 314(2) coupled in series between node $N_R$ and ground potential. The second transistor 314(2), which may operate as a switching element, includes a gate to receive a second enable signal $EN_1$. The $n^{th}$ capacitor circuit 310(n) includes an $n^{th}$ capacitor 312(n) and an $n^{th}$ transistor 314(n) coupled in series between node $N_R$ and ground potential. The $n^{th}$ transistor 314(n), which may operate as a switching element, includes a gate to receive an $n^{th}$ enable signal $EN_n$.

The enable signals $EN_1$-$EN_n$, which together may form (or be derived from) the MODE signal, control the conductive states of respective transistors 314(1)-314(n), and therefore determine which of capacitors 312(1)-312(n) are coupled in parallel between node $N_R$ and ground potential. Thus, the total capacitance of capacitor circuit 300 may be adjusted by selectively asserting a number of the enable signals $EN_1$-$EN_n$. For example, during the normal mode, all (or at least more than one) of the enable signals $EN_1$-$EN_n$ may be asserted to turn on all (or at least more than one) of respective transistors 314(1)-314(n), thereby coupling all (or at least more than one) of capacitors 312(1)-312(n) in parallel between node $N_R$ and ground potential. For some embodiments, the total capacitance value provided by coupling capacitors 312(1)-312(n) in parallel with each other may result in the nominal load capacitance for oscillator circuit 200 (e.g., the load capacitance that cause the output clock signal to have the specified frequency $f_{osc}$). Conversely, during the low power mode, none (or at least less than all) of the enable signals $EN_1$-$EN_n$ maybe asserted to turn on none (or less than all) of respective transistors 314(1)-314(n), thereby coupling none (or less than all) of capacitors 312(1)-312(n) in parallel between node $N_R$ and ground potential. For some embodiments, the total capacitance value provided by coupling none (or less than all) of capacitors 312(1)-312(n) in parallel with each other may result in the minimum load capacitance for oscillator circuit 200 (e.g., to minimize power consumption).

Note that the amount of capacitance between node $N_R$ and ground potential, as provided by programmable capacitor circuit 300, may be increased by enabling a greater number of the individually selectable capacitor circuits 310(2)-310(n), and may be decreased by enabling a fewer number of the individually selectable capacitor circuits 310(2)-310(n). In this manner, the load capacitance of the oscillator circuit 200 may be dynamically adjusted.

Figure 4:
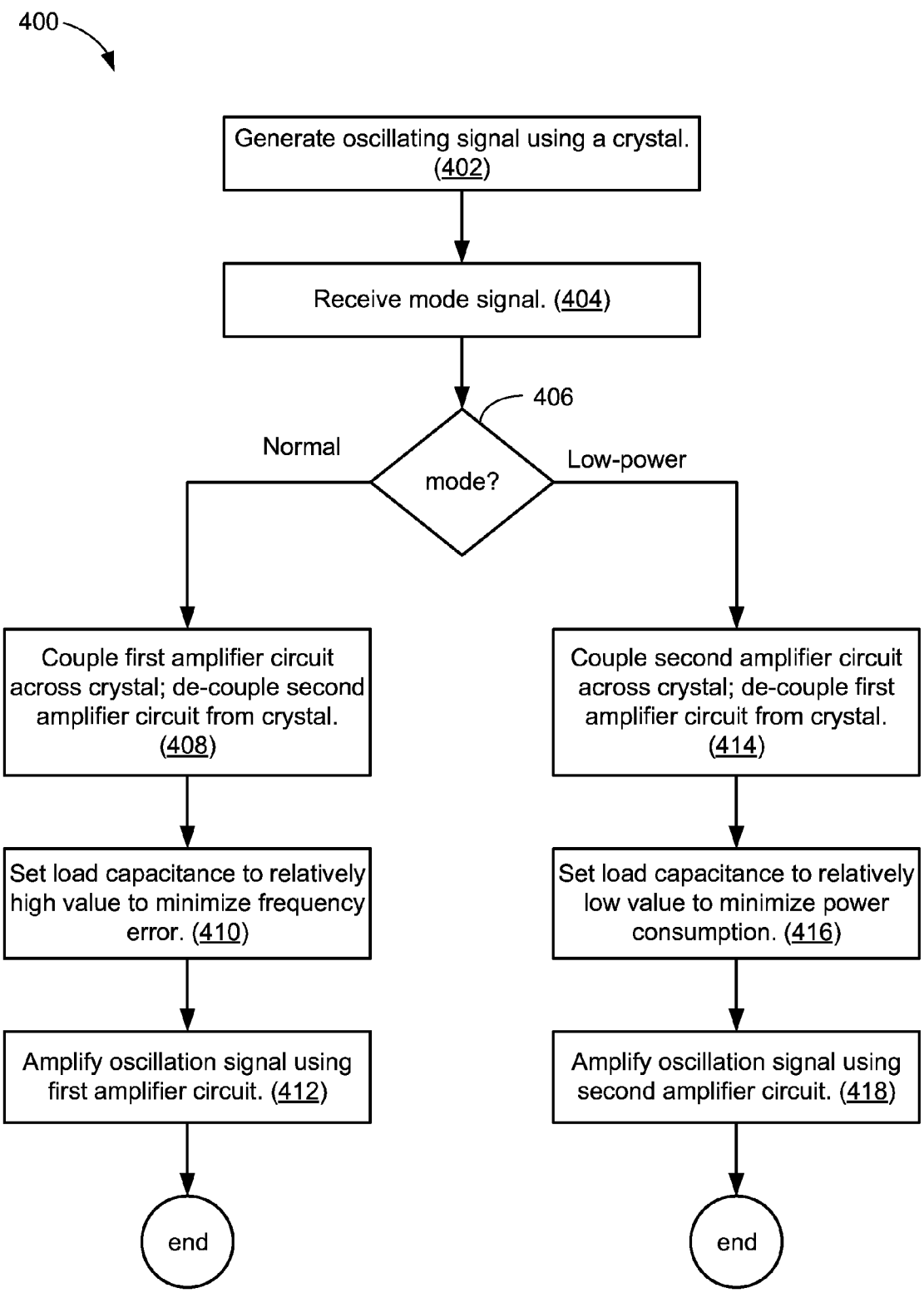
FIG. 4 is an illustrative flow chart depicting an exemplary operation of the oscillator circuit of FIG. 2A in accordance with some embodiments.

FIG. 4 shows an illustrative flow chart 400 depicting an exemplary operation of the oscillator circuit of FIG. 2A in accordance with some embodiments. First, the oscillator circuit 200 may generate an oscillating signal using the XTAL (402). Then, the oscillator circuit 200 may receive the MODE signal (404). The MODE signal may be generated by any suitable circuit (e.g., in response to a sleep state of a communication device associated with oscillator circuit 200), or may be generated by a user. If the MODE signal indicates the normal mode, as tested at 406, then the switching circuit formed by switches SW1-SW2 couples the first amplifier circuit 210A across the XTAL and de-couples the second amplifier circuit 210B from the XTAL (408). Then, the load capacitance $C_L$ is set to its nominal value (410), and the first amplifier circuit 210A amplifies the oscillation signal to generate the high-accuracy reference clock signal (412). In this manner, the oscillator circuit 200 may generate a high-accuracy reference clock signal having relatively low frequency error.

If the MODE signal indicates the low-power mode, as tested at 406, then the switching circuit formed by switches SW1-SW2 couples the second amplifier circuit 210B across the XTAL and de-couples the first amplifier circuit 210A from the XTAL (414). Then, the load capacitance $C_L$ is set to a relatively low (or minimum) value (416), and the second amplifier circuit 210B amplifies the oscillation signal to generate the low-power RTC signal (418). In this manner, the oscillator circuit 200 may generate a low-power RTC signal while minimizing power consumption.

Figure 5:
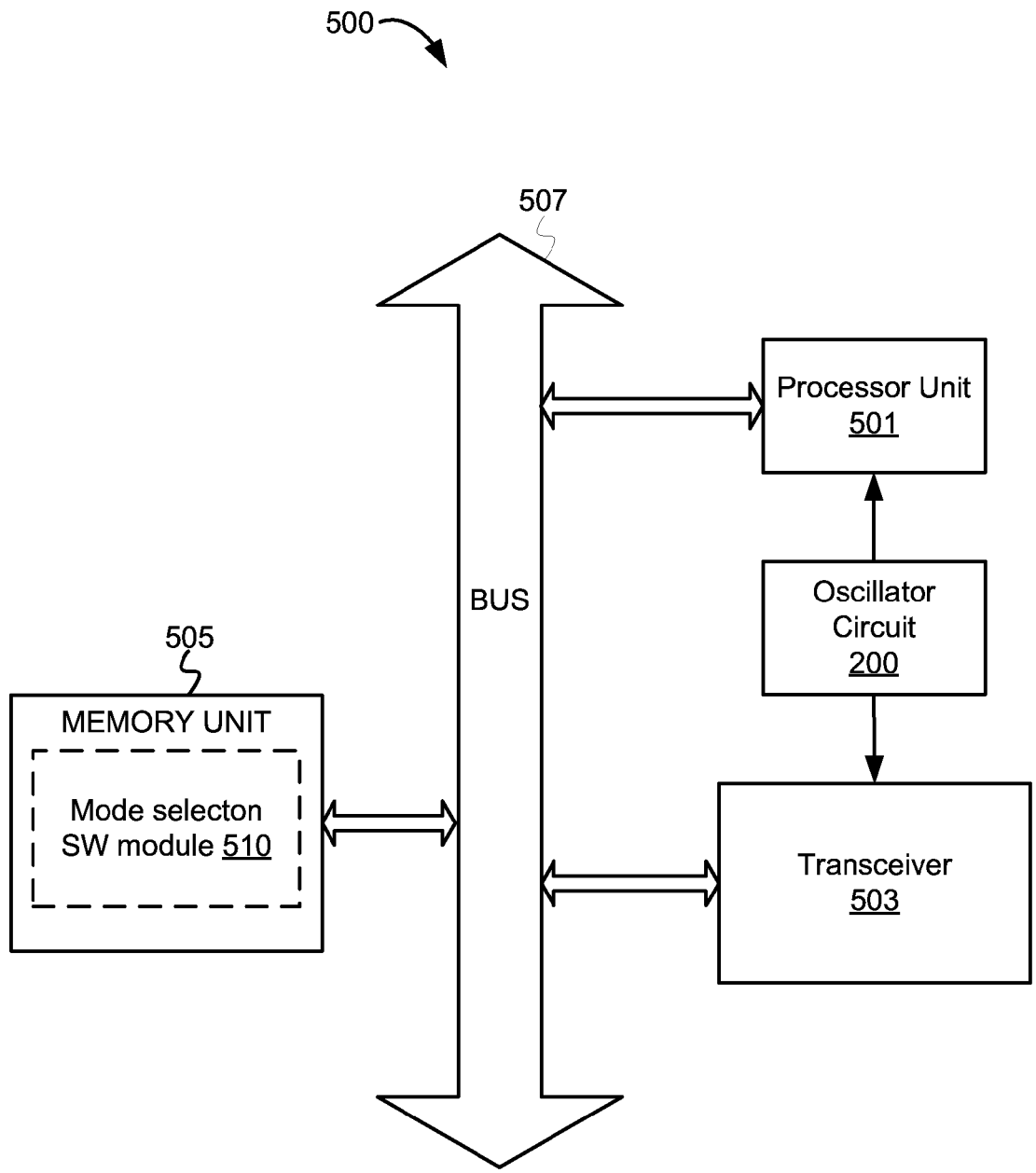
FIG. 5 is a block diagram of a communication device within which at least some of the present embodiments may be implemented.

As mentioned above, oscillator circuit 200 may be used to provide both high-accuracy reference clock signals and low-power RTC signals for any suitable communication device. For example, FIG. 5 shows a communication device 500 that may include one or more present embodiments. In some embodiments, the device 500 is a wireless device (e.g., a WLAN device, such as a personal computer, laptop or tablet computer, mobile phone, personal digital assistant, GPS device, wireless access point, or other electronic device). In at least one embodiment, the device 500 has a wired network connection.

The device 500 includes a processor unit 501, a transceiver 503, and a memory unit 505 coupled by a bus 507, and includes the oscillator circuit 200 of FIG. 2A. The processor unit 501 includes one or more processors and/or processor cores. For some embodiments, the transceiver 503 may be coupled to at least one wired network interface (e.g., an Ethernet interface, an EPON interface, an EPoC interface, etc.). For other embodiments, the transceiver 503 may be coupled to at least one wireless network interface (e.g., a WLAN interface, a Bluetooth® interface, a WiMAX interface, a ZigBee® interface, a Wireless USB interface, etc.).

The memory unit 505 includes a non-transitory computer-readable storage medium (e.g., one or more nonvolatile memory elements, such as EPROM, EEPROM, Flash memory, a hard disk drive, and so on) that stores a mode selection software module 510. In some embodiments, the software module 510 includes one or more programs with instructions that, when executed by processor unit 501, may cause the communication device 500 to perform the method 400 of FIG. 4.

The oscillator circuit 200 may provide clock signals to processing unit 501, to transceiver 503, and/or to other suitable synchronous elements (not shown for simplicity) of device 500. For example, when device 500 is in an active mode (e.g., not a sleep mode), oscillator circuit 200 may provide high-accuracy reference clock signals to transceiver 503 (e.g., to generate RF carrier signals). Conversely, when device 500 is in a low-power mode (e.g., a sleep mode), oscillator circuit 200 may provide low-power RTC signals to transceiver 503 and/or processor unit 501.

For some embodiments, the frequency of the high-accuracy reference clock signals may be substantially equal to the frequency of the low-power RTC signals. For such embodiments, oscillator circuit 200 may include or be associated with a divide-by-N circuit that down-converts the low-power RTC signal generated by oscillator circuit 200 from a range of tens of MHz to a range of tens of kHz.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An oscillator circuit to selectively switch between a normal mode and a low-power mode in response to a mode signal, the oscillator circuit comprising:
a crystal to generate an oscillating signal;
a first amplifier circuit to amplify the oscillating signal to generate, at a terminal of the crystal, a high-accuracy clock signal during the normal mode, the first amplifier circuit comprising:
a first transistor coupled across the crystal;
a first bias resistor coupled across the crystal;
a first current source to provide a bias current for the first transistor; and
a first automatic gain control circuit including an input coupled to a drain of the first transistor and including an output coupled to a control terminal of the first current source;
a second amplifier circuit to amplify the oscillating signal to generate, at the terminal of the crystal, a low-power clock signal during the low-power mode, the second amplifier circuit comprising:
a second transistor coupled across the crystal;
a second bias resistor coupled across the crystal;
a second current source to provide a bias current for the second transistor;
a second automatic gain control circuit including an input coupled to a drain of the second transistor and including an output coupled to a control terminal of the second current source;
a divide-by-N circuit including an input coupled to the terminal of the crystal; and
a compensation circuit, coupled between an output of the divide-by-N circuit and an output of the oscillator circuit, to offset a frequency error of the low-power clock signal during the low-power mode;
a switching circuit to selectively couple either the first amplifier circuit or the second amplifier circuit across the crystal in response to the mode signal;
a first variable capacitor, coupled between a first node of the crystal and ground potential, including a control terminal responsive to the mode signal; and
a second variable capacitor, coupled between a second node of the crystal and ground potential, including a control terminal responsive to the mode signal.

2. The oscillator circuit of claim 1, wherein:
during the normal mode, the first amplifier circuit is coupled across the crystal and the second amplifier circuit is isolated from the crystal; and
during the low-power mode, the first amplifier circuit is isolated from the crystal and the second amplifier circuit is coupled across the crystal.

3. The oscillator circuit of claim 1, wherein:
during the normal mode, the first and second variable capacitors are set to relatively high values to minimize a frequency error of the high-accuracy clock signal; and
during the low-power mode, the first and second variable capacitors are set to relatively low values to minimize power consumption associated with the low-power clock signal.

4. The oscillator circuit of claim 1, wherein a frequency of the high-accuracy clock signal is substantially the same as a frequency of the low-power clock signal.

5. The oscillator circuit of claim 1, wherein the mode signal comprises a plurality of enable signals, and wherein a respective one of the first and second variable capacitors comprises:
a plurality of capacitors, each selectively connected in parallel between the crystal and ground potential by a corresponding switching element in response to a corresponding one of the enable signals.

6. An integrated circuit including an oscillator circuit to selectively operate in either a normal mode or a low-power mode, the oscillator circuit comprising:
a crystal to generate an oscillating signal;
a first amplifier circuit that, when coupled across the crystal, is to amplify the oscillating signal to generate a high-accuracy clock signal, the first amplifier circuit comprising:
a first transistor coupled across the crystal;
a first bias resistor coupled across the crystal;
a first current source to provide a bias current for the first transistor; and
a first automatic gain control circuit including an input coupled to a drain of the first transistor and including an output coupled to a control terminal of the first current source;
a second amplifier circuit that, when coupled across the crystal, is to amplify the oscillating signal to generate a low-power clock signal, the second amplifier circuit comprising:
a second transistor coupled across the crystal;
a second bias resistor coupled across the crystal;
a second current source to provide a bias current for the second transistor;
a second automatic gain control circuit including an input coupled to a drain of the second transistor and including an output coupled to a control terminal of the second current source;
a divide-by-N circuit including an input coupled to a first node of the crystal; and
a compensation circuit, coupled between an output of the divide-by-N circuit and an output of the oscillator circuit, to offset a frequency error of the low-power clock signal during the low-power mode;
a switching circuit, responsive to a mode signal and coupled to the crystal, to the first amplifier circuit, and to the second amplifier circuit, wherein the switching circuit is to:
during the normal mode, couple the first amplifier circuit across the crystal and de-couple the second amplifier circuit from the crystal; and
during the low-power mode, couple the second amplifier circuit across the crystal and de-couple the first amplifier circuit from the crystal;
a first variable capacitor, coupled between the first node of the crystal and ground potential, including a control terminal responsive to the mode signal; and
a second variable capacitor, coupled between a second node of the crystal and ground potential, including a control terminal responsive to the mode signal.

7. The integrated circuit of claim 6, wherein:
during the normal mode, the first and second variable capacitors are set to relatively high values to minimize a frequency error of the high-accuracy clock signal; and
during the low-power mode, the first and second variable capacitors are set to relatively low values to minimize power consumption associated with the low-power clock signal.

8. The integrated circuit of claim 6, wherein a frequency of the high-accuracy clock signal is substantially the same as a frequency of the low-power clock signal.

9. The integrated circuit of claim 6, wherein the mode signal comprises a plurality of enable signals, and wherein a respective one of the first and second variable capacitors comprises:
  a plurality of capacitors, each selectively connected in parallel between the crystal and ground potential by a corresponding switching element in response to a corresponding one of the enable signals.

* * * * *